United States Patent [19]

Liu et al.

[11] Patent Number: 4,689,793

[45] Date of Patent: Aug. 25, 1987

[54] OPTICAL LOGIC AND MEMORY APPARATUS

[75] Inventors: Jia-ming Liu, Arlington, Mass.; Ying C. Chen, Closter, N.J.

[73] Assignee: GTE Laboratories Incorporated, Waltham, Mass.

[21] Appl. No.: 751,707

[22] Filed: Jul. 3, 1985

Related U.S. Application Data

[63] Continuation-in-part of Ser. No. 683,776, Dec. 19, 1984, Pat. No. 4,612,645.

[51] Int. Cl.⁴ .............................................. H01S 3/00
[52] U.S. Cl. .................................. 372/8; 250/213 A; 307/311
[58] Field of Search ............... 372/8, 44, 19; 307/311; 250/213 A

[56] References Cited

U.S. PATENT DOCUMENTS

4,506,151  3/1985  MacDonald et al. .......... 250/213 A
4,518,934  5/1985  Venkatesan ........................ 372/21
4,555,785  11/1985  Scifres et al. .......................... 372/8

FOREIGN PATENT DOCUMENTS

0645169  6/1979  U.S.S.R. .......................... 250/213 A

OTHER PUBLICATIONS

I. G. Akmenkalns et al, "Optically Controlled Latch Circuit", IBM TDB, vol. 3, No. 3, Aug. 1960, p. 38.

*Primary Examiner*—James W. Davie
*Attorney, Agent, or Firm*—Fred Fisher

[57] ABSTRACT

A complete set of optical logic gates and circuits based upon direct polarization switching, and various types of optical flip-flops based upon polarization bistability, in semiconductor lasers are described. By operating the laser in the direct polarization switchable mode, logic gates and circuits such as inverter, AND, NAND, OR and NOR can be provided with two optoelectronic switches or photodetectors. With the laser being operated in the polarization bistable mode, clocked optical flip-flops are operable with a few optoelectronic switches or photodetectors.

32 Claims, 20 Drawing Figures

TE : AND
TM : NAND

TE : NAND
TM : AND

TE : OR
TM : NOR

TE : NOR
TM : OR

S-R FLIP-FLOP

D FLIP-FLOP

OPTICAL LOGIC AND MEMORY APPARATUS

CROSS REFERENCE TO RELATED APPLICATION

This is a continuation-in-part of our U.S. patent application Ser. No. 683,776, filed Dec. 19, 1984 for FAST POLARIZATION-SWITCHABLE SEMICONDUCTOR LASERS, now U.S. Pat. No. 4,612,645 issued 9/16/86.

BACKGROUND OF THE INVENTION

1. Field of the Invention

This invention relates to optical logic and memory apparatus including optical logic gates and circuits and optical flip-flops. Accordingly, it is a general object of this invention to provide new and improved apparatus, gates, circuits and flip-flops of such character.

2. General Background

Logic gates and memory elements are the basic building blocks of a digital system. A digital system can be constructed entirely from NAND (or NOR) gates and flip-flops in which the gates perform combinational logic operations and the flip-flops perform sequential logic operations and memory functions. Conventional electronic flip-flops utilize a combination of complex logic gates.

The operation of an optical AND gate has been reported by J. C. Campbell, A. G. Dentai, J. A. Copeland and W. S. Holden, "Optical AND Gate", IEEE J. Quantum Electron., QE-18, 992 (1982). Campbell et al., however, require two optical input signals at different wavelengths and an output signal at still another wavelength. Its laser delivers an output signal having an inherent pulsation period that limits the operation of the gate.

A. Lattes, H. A. Haus, F. J. Leonberger, and E. P. Ippen, "An Ultrafast All-Optical Gate," IEEE J. Quantum Electron., QE-19, 1718 (1983), propose an optical exclusive-OR circuit based on the guided wave Mach-Zehnder interferometer. Disadvantageously, the realization of this operation appears to be awaiting the discovery of materials of extraordinarily large optical non-linear coefficient.

A demonstration of optical S-R and J-K flip-flops has been reported by K. Okumura, Y. Ogawa, H. Ito, and H. Inaba, "Optical Bistability and Monolithic Logic Functions Based on Bistable-Laser Light-Emitting Diodes", 13th IQEC, paper TuBB2, Anaheim, Calif., June 1984. Their flip-flops combine many basic logic elements in the same way that electronic flip-flops are usually constructed. The speed of the complex circuitry appears extremely low (in the neighborhood of hundreds of microseconds). They are, basically, simulations of electronic flip-flops with optical input and output.

Many known bistable light emitting devices incorporate a section of saturable absorber in the laser cavity, such as, for example, H. Kawaguchi and G. Iwane, "Bistable Operation in Semiconductor Lasers with Inhomogeneous Excitation", Electron. Lett., Vol. 17, pp. 167–168 (1981); Ch. Harder, K. Y. Lau, and A. Yariv, "Bistability and Negative Resistance in Semiconductor Lasers", Appl. Phys. Lett., 40, 124 (1982); K. Y. Lau, Ch. Harder, and A. Yariv, "Dynamic Switching Characteristics of a Bistable Injection Laser", Appl. Phys. Lett., 40, 198 (1982); Ch. Harder, K. Y. Lau, and A. Yariv, "Bistability and Pulsations in cw Semiconductor Lasers with a Controlled Amount of Saturable Absorption", Appl. Phys. Lett., 39, 392 (1981); and Ch. Harder, K. Y. Lau, and A. Yariv, "Bistability and Pulsations in Semiconductor Lasers with Inhomogeneous Current Injection", IEEE J. Quantum. Electron., QE-18, 1351 (1982). As reported therein, the carrier density in the absorbing section is low when the device is in the "off" state. Switching from the "off" state to the "on" state takes tens of nanoseconds (in accordance with the immediate foregoing reference) which is the time lapse for the carrier density to build up. Such slow switching speed imposes serious limitations on the usefulness of the devices for high speed applications.

SUMMARY OF THE INVENTION

Another object of this invention is to provide a new and improved apparatus in which the laser diode can be operated in the direction polarization switchable mode in which logic gates and circuits such AND, NAND, OR, and NOR can be constructed with two optoelectronic switches or photodetectors.

Yet another object of this invention is to provide a new and improved apparatus having a laser operating in a polarization bistable mode wherein clocked optical flip-flops are constructed with few optoelectronic switches or photodetectors.

Still another object of this invention is to provide a new and improved optical flip-flop which can be constructed without the use of logic gates.

Yet still another object of this invention is to provide new and improved circuitry having uncomplicated flip-flops that are suitable for monolithic integration and high speed applications.

In accordance with one aspect of the invention, an optical logic/memory apparatus includes a semiconductor laser diode that operates at the polarization transistion temperature as a logic device wherein the laser diode operates in a pure TM mode at low injection currents and operates in a pure TE mode at high injection currents. The laser diode abruptly changes its modal state at a polarization-switching current level $I_c$ and operates near the polarization transition temperature wherein the laser diode operates in a pure $TM_{oo}$ mode at low injection currents and switches operation to a pure $TE_{oo}$ mode at high high injection currents, having large hysteresis loops with a high contrast ratio in its polarization-resolved power versus current characteristic while the total power exhibits only slight change in hysteresis. The switching behavior of the TE mode is complementary to that of the TM mode. Means are provided for biasing the laser diode. Optoelectronic means are coupled to the laser diode for affecting its modal state.

In accordance with another aspect of the invention, polarization-bistable apparatus includes a semiconductor laser that operates near the polarization transition temperature wherein the laser operates in a pure $TM_{oo}$ mode at low injection currents and switches operations to a pure $TE_{oo}$ mode at high injection currents, having large hysteresis loops with a high contrast ratio in its polarization-resolved power versus current characteristic while total power exhibits only a slight change in hysteresis, the switching behavior of the $TE_{oo}$ mode being complementary to that of the $TM_{oo}$ mode. Means are provided for biasing the laser for operation within the hysteresis loops and means are provided for applying a current pulse in one direction to the laser to cause the laser to provide a $TE_{oo}$ mode laser output and for applying a current pulse in the opposite direction to switch to a $TM_{oo}$ mode. In accordance with certain features of the invention, the laser can be an InGaAsP-/InP laser.

In accordance with yet another aspect of the invention, an optical S-R flip-flop incudes a semiconductor laser operating near the polarization transition temperature. Also included are means for biasing such laser for operation within hysteresis loops, first means coupled across a voltage source of one polarity and the laser for causing the laser to switch to the $TE_{oo}$ mode operation following application of an optical signal S thereto, and second means coupled across a voltage source of the opposite polarity and the laser for causing the laser to switch to the $TM_{oo}$ mode operation following application of an optical signal R thereto. In accordance with certain features, the foregoing means provide a conductive path upon receiving an optical clock pulse.

In accordance with still other aspects of the invention, an optical D flip-flop, an optical J-K flip-flop, and an optical T flip-flip are provided.

In another aspect of the invention, an inverter is provided, utilizing polarization-defined logic, wherein a TE modal signal is a 1 and the TM modal signal is a 0, or vice versa. The new use of a half-wave plate as an INVERTER includes inserting the half-wave plate in the Path of a light beam that is polarized at different time intervals in a TE mode and a TM mode, representing a 1 and a 0, repectively to "invert" the TE mode and the TM mode light to TM mode and TE mode light, representing a 0 and 1, respectively.

Yet still another aspect of the invention sets forth an optical TE-AND (TM-NAND) gate which includes a semiconductor laser diode operating at the polarization transistion temperature wherein the laser diode operates in a pure TM mode at low injection currents and operates in a pure TE mode at high injection currents, the laser diode abruptly changing its modal state at a polarization switching current level $I_c$. The laser diode is biased just below the polarization swtiching current level $I_c$. A pair of optoelectronic switching means are coupled across a voltage source of such polarity and the laser diode so that when both of the switching means are conductive, the injection current level is higher than $I_c$ and the laser diode switches into the TE polarization, whereby the laser diode provides a TE output representing the logic function A·B and the laser diode provides a TM output representing the logic function $\overline{A \cdot B}$, whereby one of the switching means is normally non-conductive but is rendered conductive upon receiving a light signal representing the function A and whereby the other of the switching means is normally non-conductive but is rendered conductive upon receiving a light signal representing the function B. In accordance with certain features, the laser diode is an InGaAsP/InP laser diode.

In accordance with certain other aspects of the invention, an optical TE-NAND (TM-AND) gate includes similar but corresponding elements. Also, optical TE-OR (TM-NOR) circuitry, in addition to an optical TE-NOR (TM-OR) circuitry, are described.

BRIEF DESCRIPTION OF THE DRAWINGS

Other objects, advantages and features of this invention, together with its construction and mode of operation, will become more apparent from the following description, when read in conjunction with the accompanying drawing, in which.

DESCRIPTION OF PREFERRED EMBODIMENT(S)

In this specification, we set forth a complete set of optical logic gates and flip-flops based upon direct polarization switching (as described more fully in our parent application, supra, Ser. No. 683,776 filed Dec. 19, 1984 and which is incorporated herein by reference) and polarization bistability in semiconductor lasers as set forth immediately below.

Optical polarization bistability is observed in semiconductor lasers. The phenomena is especially observed in InGaAsP/InP lasers operating near the polarization transition temperature which is characteristic of each individual laser. In this temperature regime, the lasers operate in a pure $TM_{oo}$ mode at low injection currents, and switch operation to a pure $TE_{oo}$ mode at high injection currents. Large hysteresis loops with high contrast ratios are observed in the polarization-resolved power versus current characteristics while the total power exhibits only slight changes in hysteresis. The switching behavior of the TE mode is complementary to that of the TM mode. Because this type of switching does not involve change of carrier density, the switching speed is, in principle, limited only by the photon lifetime of each mode. Subnanosecond switching speed can easily be achieved.

By operating the laser diode in a direct polarization switchable mode, logic gates such as AND, NAND, OR, and NOR can be constructed with two optoelectronic switches or photodetectors. When the laser diode is operated in the polarization bistable mode, clocked optical flip-flops can be constructed with a few optoelectronic switches or photodetectors.

Figure 1A:
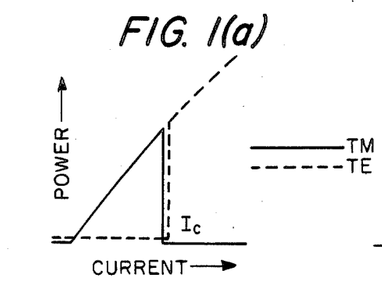
FIG. 1A is a diagram of power-current characteristics of an InGaAsP/InP laser diode operating in a polarization switchable mode.
Figure 1B:
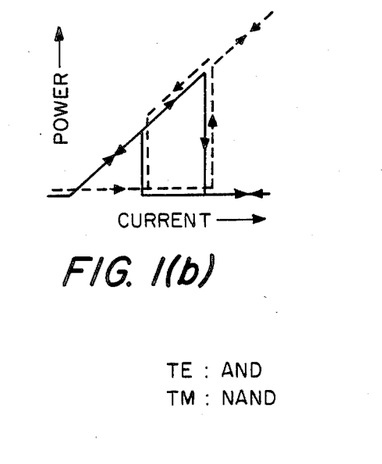
FIG. 1B is a diagram of power-current characteristics of an InGaAsP/InP laser operating in the polarization bistable mode.

In semiconductor lasers, there are two allowed polarization states constrained by the waveguide geometry of the laser cavity. They are referred to as the transverse electric (TE) mode with the electric field parallel to the plane of the p-n junction, and the transverse magnetic (TM) mode with the magnetic field parallel to the juction plane. Under normal operation conditions, the laser output is purely TE-polarized because the net gain of the TE mode is higher. However, the TM mode can be promoted to compete with the TE mode by applying an appropriate stress to the active layer of the semiconductor laser so as to induce a lattice deformation, thereby enhancing the gain of the TM mode relative to that of the TE mode. The TE-TM mode of competition has been observed in some InGaAsP/InP lasers operating near the characteristic polarization switching temperature $T_c$ of each individual laser. This phenomenon is believed to be caused by the temperature dependent internal thermal stress which exists in the layered structure of the laser due to compositional differences in the layers. In this temperature regime, the laser operates in a pure TM mode at low injection currents and switches operation to a pure TE mode at high injection currents. At a temperature just below $T_c$, the polarization-resolved cw power-current characteristics of a laser exhibit an abrupt polarization transition at a characteristic injection-current level, as illustrated in FIG. 1A. When a laser is operated in this direct-polarization-switchable mode, its output can be directly switched between the TM and TE modes by changing the injection-current level. With fast-rising current pulses, subnanosecond switching speeds are achieved and the switching extinction ratio is very high. At temperatures range near the polarization transistion temperature, hysteresis loops can be observed in the polarization-resolved power-current characteristics, as illustrated in FIG. 1B. The widths of the hysteresis loops can be varied by controlling the operating temperature. When the laser is operated in this polarization-bistable mode and is biased in the middle of the hysteresis loop, the light output can be switched between the two polarization states by injection of short electrical or optical pulses. When the laser initially operates in the TM mode, a negative current pulse can switch the laser output to the TE mode, while a subsequent positive current pulse switches it back to the TM mode. It is noted that the injection current in FIGS. 1A and 1B (toward the right) is negative. With very short current pulses, instrument limited switching times on the order of 1 ns have been observed. The far-field patterns parallel to the junction plane of the TM and TE modes in the bistable regime, taken at the same temperature with the same injection current, are both single-lobed and centered within 1° of each other. The beam divergence is 23.4° for the TM mode, and 24.5° for the TE mode. Thus, the two orthogonally polarized modes occupy nearly the same space. Hence, the two polarization states can be coupled simultaneously into a fiber or optical waveguide without relative beam movement. Based on direct polarization switching and polarization bistability in semiconductor lasers, a complete set of optical logic gates and flip-flops can be operated with circuitry consisting of polarization-bistable lasers and a few optoelectronic switches.

A desired optoelectronic switch for use in accordance with this invention includes the transmission line formed on a semi-insulating semiconductor, such as GaAs or InP having a small gap (on the order of 10 microns) in the top metallization. When the gap is illuminated with a laser pulse that is absorbed near the semiconductor surface, the electron-hole plasma, forming a conducting path across the gap, turns the switch on. The switch turns off rapidly at the end of the optical pulse, due to a short carrier lifetime.

The characteristics of polarization switching has been described in detail in our parent application, cited earlier. This same laser can be operated in the direct polarization switchable mode without hysteresis in the power/current characteristics or in the polarization bistable mode with controllable hysteresis in the power/current characteristics, by controlling the operating temperature within a few degrees. The characteristics of these two modes of operation are illustrated schematically in FIGS. 1A and 1B, respectively. As the laser is always lasing througout its operation, in our devices, and changes states by changing the polarization of the output emission, we have the following two types of logic operations:

With positive intensity-defined logic, a high intensity output is 1 and a low or zero intensity output is 0. Since the laser is always lasing, either in the TE or TM mode, in our invention, the logic function carried by the TE output is always the complement of that carried by the TM output.

With the polarization defined logic, one polarization in a "1" state, the other is a "0" state, disregarding the absolute intensity level. For example, TE is 1 and TM is 0, or vice versa. In this case, only one set of digits or one logic function is represented by the output of a laser. The TE and TM modes are not separated when the data is read or processed. A TE-TM mode converter, such as a half-wave plate, is an INVERTER.

In the following description of optical logic gates and optical flip-flops, we use the positive intensity-defined logic.

For optical logic operations, optical bistability is not required. The laser is operated in the direct polarization switchable mode with the cw power-current characteristics as shown in FIG. 1A. At a current level below $I_c$, the laser output is TM polarized. Above $I_c$, the laser output changes to TE polarization. As noted previously, the polarity of the injection current $I_c$ is negative.

In principle, any logic function can be constructed entirely from NAND gates or from NOR circuits. The circuits for each individual gate are described hereinafter. As the TE and TM outputs from a laser are complement functions in an intensity-defined logic, an AND gate for the TE light emission is a NAND for the TM emission, and vice versa. Similarly, an OR circuit for the TE emission is a NOR circuit for the TM emission, and vice versa.

AND and NAND gates

Figure 2A:
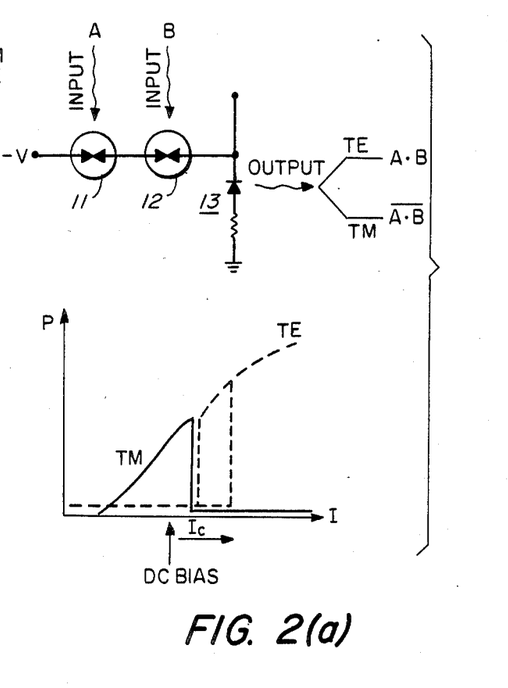
FIG. 2A is a diagram of a circuit that is both an optical AND gate for the TE light emission and an optical NAND gate for the TM emission, including a pair of optoelectronic switches.
Figure 2B:
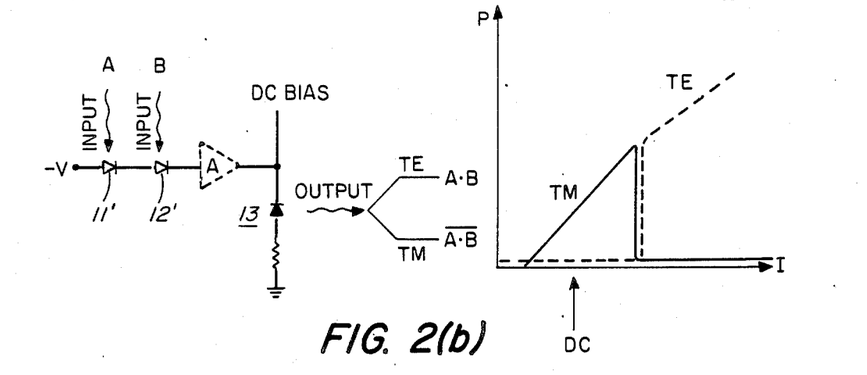
FIG. 2B is a diagram similar to that of FIG. 2A wherein reversed biased photodetectors are used in lieu of optoelectronic switches.

FIGS. 2A and 2B show the TE-AND (TM-NAND) gate. In FIG. 2A, the circuit includes two high-speed optoelectronic switches 11, 12 in series. A laser diode 13 is biased just below the polarization switching current level $I_c$. When either or both input signals A, B are 0, the switches 11, 12 in series are non-conductive and the laser diode 13 output is TM polarized. When both input signals A and B are 1, the switches 11, 12 are both conductive. The negative voltage, $-V$, and the impedances of the switches 11, 12 are adjusted so that, when both switches 11, 12 are conducting, the injection current level is higher than $I_c$ and the laser diode 13 output switches into the TE polarization. The TE output represents the logic function A·B and the TM output represents $\overline{A \cdot B}$ The optoelectronic switches 11, 12 in FIG. 2A can be replaced with two photodetectors 11', 12' in series, connected under reverse bias, as indicated in an alternative shown in FIG. 2B.

In the configuration depicted in FIG. 2B, the laser diode 13 is biased farther below the polarization switching current level $I_c$, such that, when only one photodetector 11', 12' is conducting, the increase in the injection current is insufficient to switch the laser 13 output into TE polarization. When both A and B are 1, the increase in injection current is then large enough to switch the laser 13 output into the TE polarization. Since the photodetectors 11', 12' generally do not deliver much current, an amplifier A may be required. With optoelectronic switches 11, 12, as depicted in FIG. 2A, the laser 13 can be switched without an amplifier.

Figure 3A:
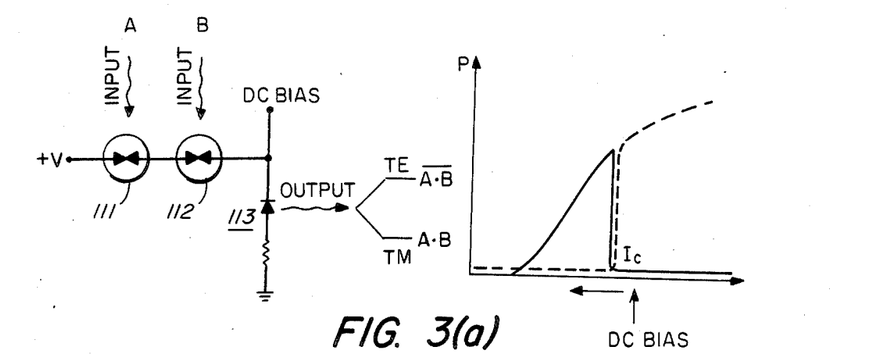
FIGS. 3A and 3B are circuit diagrams utilizing optoelectronic switches and photodetectors, respectively, of an optical NAND gare for TE light emission and an optical AND gate for TM emission.
Figure 3B:
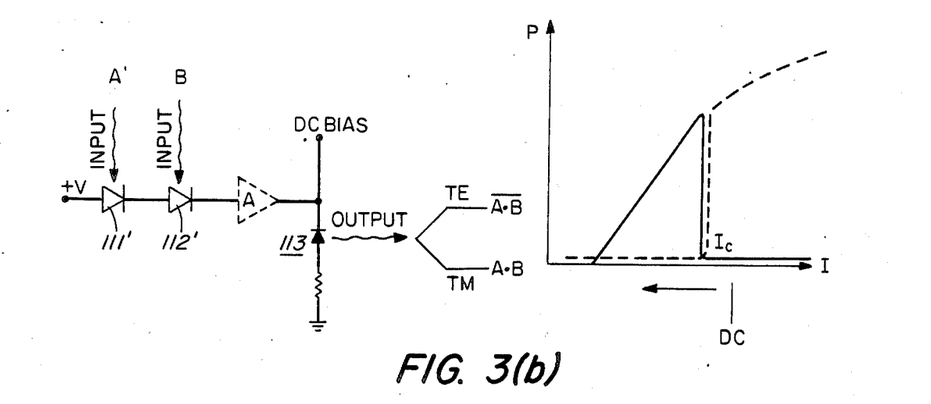

FIGS. 3A and 3B illustrate the TE-NAND (TM-AND) gate. In these circuits depicted in FIGS. 3A and 3B, the optoelectronic switches 111, 112 and the photodetectors 111', 112' are biased with positive voltage, $+V$, and the laser 113 is biased negatively at a current level above $I_c$. The operations of these circuits are similar to those in FIGS. 2A and 2B, except that the TE output now represents $\overline{A \cdot B}$ and the TM output represents A·B.

OR and NOR circuits

Figure 4A:
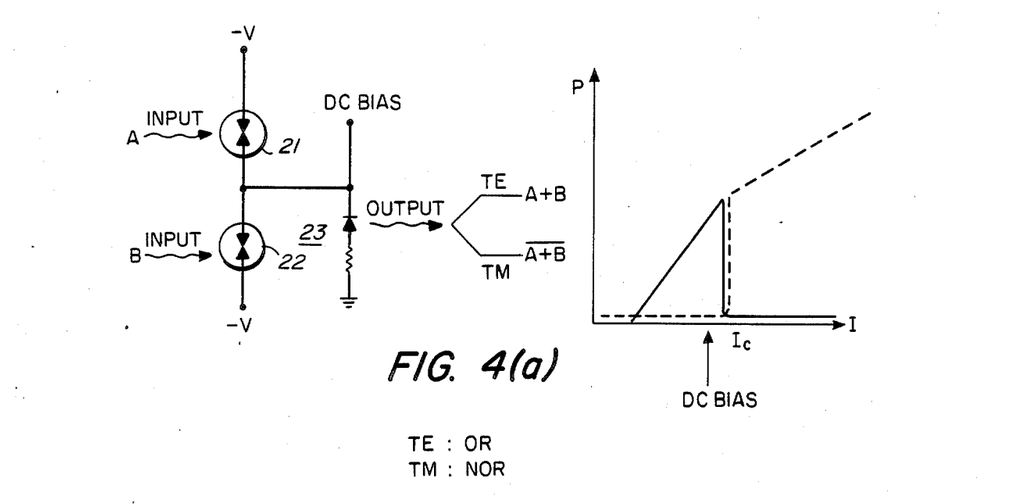
FIGS. 4A and 4B are circuit diagrams, utilizing optoelectronic switches and photodetectors, respectively, of a TE-OR circuit and TM-NOR circuit.
Figure 4B:
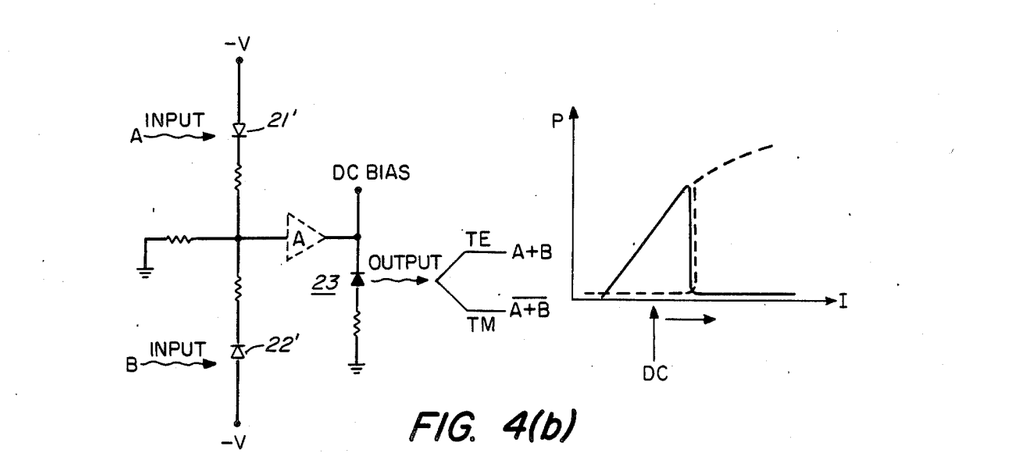

FIGS. 4A and 4B show the TE-OR (TM-NOR) circuit. In FIG. 4A two optoelectronic switches 21, 22 in parallel are each negatively biased with the same voltage, $-V$, and the laser diode 23 is biased at a DC level just below $I_c$. The circuit parameters are adjusted so that one conducting switch 21 or 22 is sufficient to increase the injection current level to switch the laser 23 output from TM polarization to TE polarization. The TE and TM output signals, therefore, represent A+B and $\overline{A+B}$, respectively. FIG. 4B shows an alternative circuit using photodetectors PD.

The circuit depicted in FIG. 4B is basically the same configuration as that in FIG. 2B, except that the laser diode 23 is now biased just below $I_c$ so that only one conducting photodetector 21' or 22' is required to switch the polarization of the laser output from TM to TE polarization.

Figure 5A:
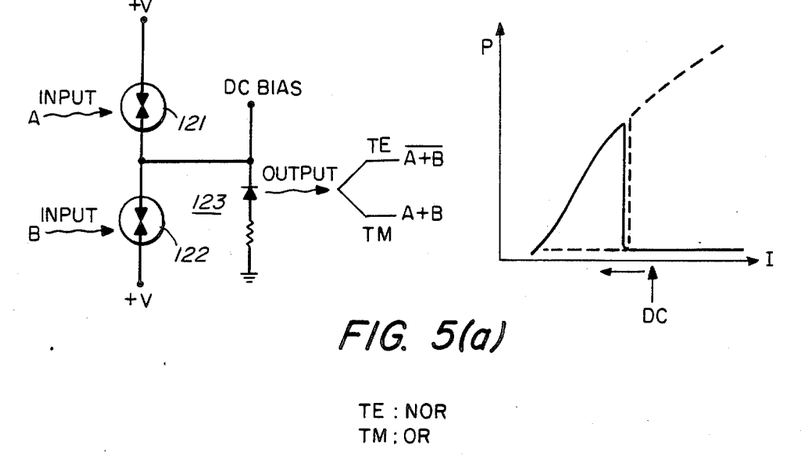
FIGS. 5A and 5B are circuit diagrams, utilizing optoelectronic switches and photodetectors, respectively, of a TE-NOR circuit and a TM-OR circuit.
Figure 5B:
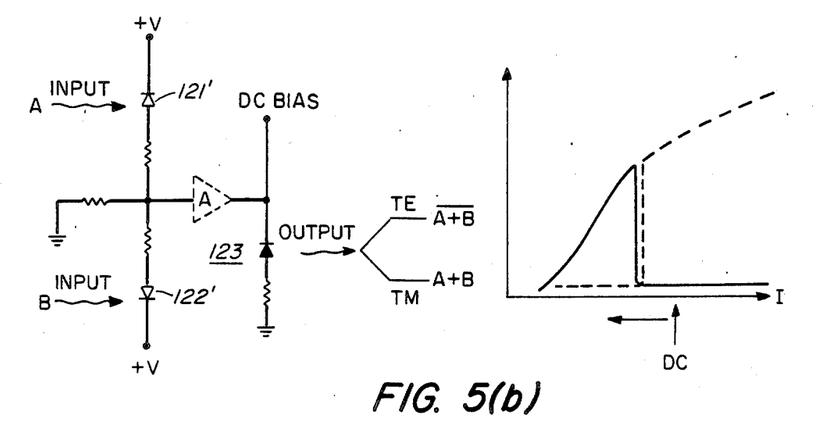

The TE-NOR (TM-OR) circuit is depticted in FIGS. 5A and 5B. The operations of these circuits are similar to those of the circuits in FIGS. 4A and 4B, except that the optoelectronic switches 121, 122 and the photodetectors 121', 122' are now biased with positive voltage and the laser 123 is biased negatively at an injection current level just above $I_c$. The TE and TM output signals represent $\overline{A+B}$ and A+B, respectively.

Optical Flip-Flops

Flip-flops are the basic memory elements in a digital system. A flip-flop has two stable states and stores one bit of information in a binary system. Flip-Flops can be used in pulsed sequential logic systems, in which each of the flip-flops is a clocked device. The sequential systems are synchronous. They operate in synchronism with a train of system clock pulses, CP, at a fixed clock rate. One bit of information is defined by the time interval between two successive clock pulses. A clocked flip-flop changes state as a result of the occurence of a clock pulse. $Q_n$ refers to the state of a flip-flop before the occurrence of the clock pulse CP, and $Q_{n+1}$ refers to the state of the device after the occurrence of the clock pulse CP. The basic operations of a flip-flop are: set ($Q_{n+1}=1$), reset ($Q_{n+1}=0$), and complement ($Q_{n+1}=\overline{Q}_n$). By operating the laser in the polarization bestable mode, as shown in FIG. 1B, optical flip-flops can be easily provided. When the laser is biased in the middle of the hysteresis loop, it can be switched between the two stable states of orthogonal polarization by injection of short electrical or optical pulses. When the laser initially operates in the TM mode, a negative current pulse of sufficient amplitude can switch the laser output to the TE mode, while a positive current pulse can switch it from TE to TM polarization.

Basically, there are four types of flip-flops: S-R, D, J-K, and T. In conventional electronic systems, the S-R flip-flop is the basic element and the other types df flip-flops can be constructed with an S-R flip-flop and a few NAND gates. In the following, we demonstrate the operation of the flip-flops with an independent circuit for each type. Without the use of extra NAND gates, each circuit has a similar simplicity and has a similar high speed.

Bistable Devices

The phenomenon of optical polarization bistability is observed in semiconductor devices such as double heterostructure semiconductor lasers, specifically, InGaAsP/InP lasers operating near the polarization transition temperature (which is characteristic of each individual laser). In this temperature range, the lasers operate in a pure $TM_{oo}$ mode at low injection currents and switch operation to a pure $TE_{oo}$ mode at high injection currents. Large hysteresis loops with high contrast ratios are observed in the polarization-resolved power vs current characteristics, while the total power exhibits only slight changes in the hysteresis. The switching behavior of the TE mode is therefore complementary to that of the TM mode. Since this type of switching does not involve change of the carrier density, the switching speed is, in principle, limited only by the photon lifetime of each mode. Thus, subnanosecond switching speed can easily be achieved.

The polarization-resolved cw power/current characteristics of a laser at various temeratures are of interest. At 195.2° K. and above, this laser, an InGaAsP/InP laser, operates in a pure TE mode and the power-current characteristics are kink-free. The threshold current is 3.5 mA at 195.2° K.

Below 195.2° K., the laser output starts to show the TM stimulated emission above the threshold current. The temperature dependent polarization behavior is attributed to the internal thermal stress in the active layer which modifies the band structure and thereby changes the optical gain of the TM mode relative to that of the TE mode. The TM stimulated emission quickly becomes dominant with decreasing temperature.

At 194.2° K., the laser operates in a pure TM mode at low injection currents and abruptly switches operation to a pure TE mode at 15 mA. From a thermal impedance neasurement, the junction temperature increase at 15 mA is estimated to be 0.8° C., sufficient to move the laser into the TE dominated regime. With further decreases in temperature, hysteresis loops can be observed in the polarization-resolved power/current characteristics. The width of the hysteresis loop varies from about 1 mA at 193.5° K. to 23 mA at 186.7° K. Below 186.7° K., the laser operates in a pure TM mode at low injection currents and switches into a mixture of TE and TM modes at 45 mA and the hysteresis disappears.

From the smooth and single lobe far-field patterns and the well behaved longitudinal mode spectra, it appears that the two orthogonally polarized modes, the TM and TE modes, occupy nearly the same space, and, hence, can be designated at $TM_{oo}$ and $TE_{oo}$ modes. Thus, for practical applications, light from the two polarization states can be simultaneously coupled into a fiber or a waveguide without relative beam movement.

When the laser is biased within a hysteresis loop, it can be switched between the two stable states of different polarization by injection of short electrical or optical pulses. For example, when the laser is operated in the middle of the hysteresis loop at 193.0° K., with a DC bias current of $-20$ mA, the width of the hysteresis loop is 3.5 mA. This small hysteresis loop is chosen to minimize the pulse amplitude needed to overcome the phenomenon of critical slowing down. Thus, assume the laser initially operates in the TM mode. A negative current pulse switches the laser output to the TE mode while a subsequent positive current pulse switches the laser output back to the TM mode. With a pulse amplitude of 40 mA, the switching takes place within 2 ns, limited by the risetime of the current pulses and the time resolution of the oscilloscope. The switching time can be easily shortened to within 1 nsec if fast rising pulses are used. The short switching time can be understood from the fact that switching between the two polarization states does not involve change of carrier density. The contrast ratio between the "on" and the "off" states is larger than 20:1, while in conventional bistable lasers, the ratio is usually less than 6:1. This is becuase, without a large absorbing section found in many of the prior art bistable light emitting devices, the carrier density required for lasing is much lower, resulting in significantly reduced spontaneous emission intensity.

S-R flip-flop

Figure 6A:
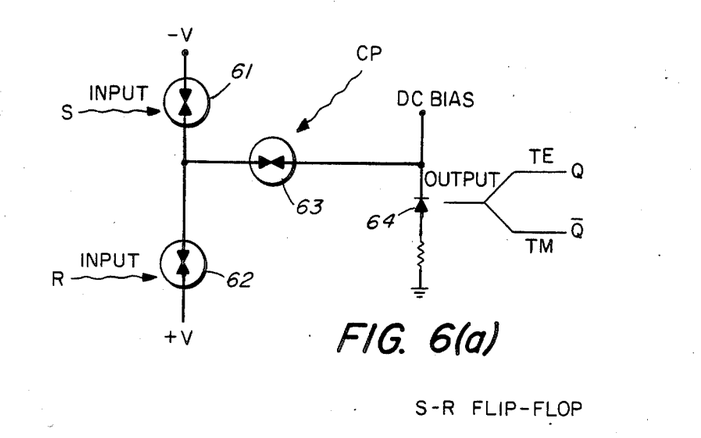
FIGS. 6A and 6B are circuit diagrams of an optical S-R flip-flop using optoelectronic switches and photodetectors, respectively, in accordance with one aspect of the invention.

FIG. 6A shows a circuit of an S-R flip-flop comprising three high-speed optoelectronic switches 61, 62, 63 and a polarization bistable laser diode 64 which is biased in the middle of its hysteresis loop. Two switches 61, 62 are used as the input ports of the flip-flop to receive the digital optical input signals S and R, respectively. The third switch 63 is activated by a train of optical clock pulses CP, and is used to sample the output of the first two switches 61, 62 in synchronism with the clock pulses CP. The output pulses from the switch 63 then triggers the laser diode 64 to switch the polarization of its output at the repetition rate of the clock pulses CP. One bit of the output data is defined by the time interval between two successive clock pulses. As previously discussed, the TE and TM outputs constitute the normal output Q and its complement $\bar{Q}$, respectively. In the absence of a clock pulse CP, changes in the logic state of the data input cause no change in the output. When a clock pulse arrives, and S=0 and R=0, no voltage is applied to the third switch 63 and there is no sampled output pulse to trigger the laser 64. The laser 64 staps in its previous state $Q_n$.

If S=0 and R=1 at the moment of the clock pulse, a positive output pulse propagates through the third switch 63. The laser 64 output is switched from TE to TM. If the laser 64 initially operates in the TM mode, it stays in the TM mode at the triggering of a positive pulse. Therefore, the condition S=0 and R=1 always results in $Q_{n+1}=0$ and $\bar{Q}_{n+1}=1$. When S=1 and R=0, a negative pulse is sampled that triggers the laser to operate in the TE mode. The condition S=1 and R=1 is forbidden in conventional electronic S-R flip-flops because it results in an indeterminate state as indicated by the question mark in FIG. 6C. However, in our optical S-R flip-flop, we have experimentally observed that when the two input ports are well balanced, the condition S=1 and R=1 generates $Q_{n+1}=Q_n$ and is not indeterminate. The logic diagram and the truth table of the S-R flip-flop are shown in FIG. 6C. As the switching behavior of the TE mode is always complementary to that of the TM mode, in a polarization bistable laser, the TE and TM output signals constitute the normal output, Q, and its complement, $\bar{Q}$, respectively.

Figure 6B:
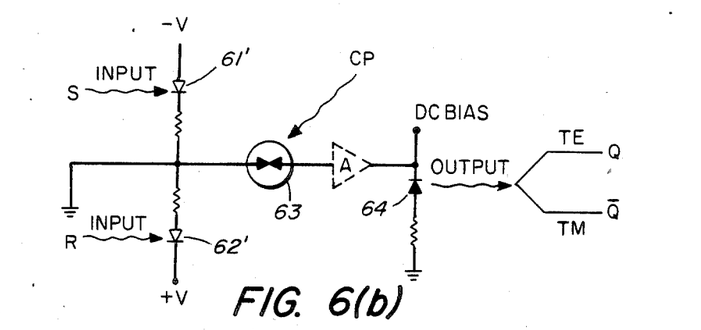
Figure 6C:
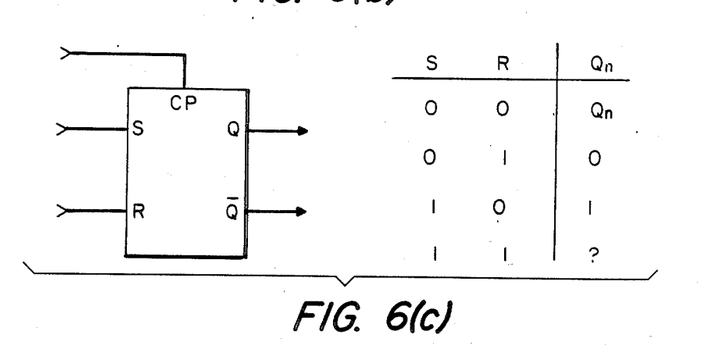
FIG. 6C shows a logic diagram and a truth table for the S-R flip-flop depicted in FIGS. 6A and 6B.

FIG. 6B shows an alternative circuit using photodetectors 61' and 62' in lieu of the optoelectronic switches 61 and 62 in FIG. 6A. In the case illustrated in FIG. 6B, an amplifier A is usually required because the photodetectors 61' and 62' cannot deliver a large enough current to switch the laser 14. Desirably, all optical signals, including the clock pulses, are generated by semiconductor lasers (not shown).

D Flip-flop

Figure 7A:
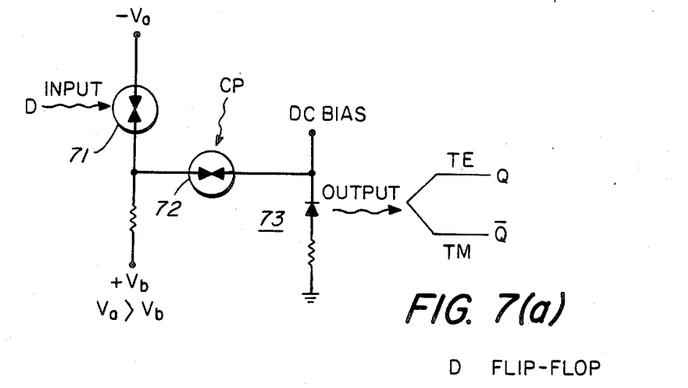
FIGS. 7A and 7B are circuit diagrams and FIG. 7C shows a logic diagram and a truth table of an optical D flip-flop in accordance with another aspect of the invention.

FIG. 4A shows the circuit of a D flip-flop including two optoelectronic switches 71, 72. When D=0, the switch 71 at the input port is non-conductive. A clock pulse CP activates the sampling optoelectronic switch 72 to deliver a positive current pulse to trigger the laser 73 to operate in the TM mode. When D=1, the input switch 71 is conductive. Since the absolute value of $V_a$ is greater than the absolute value of $V_b$, a negative current pulse is then generated at the sampling switch 72 by the clock pulse CP to trigger the laser 73 to operate in the TE mode.

Figure 7B:
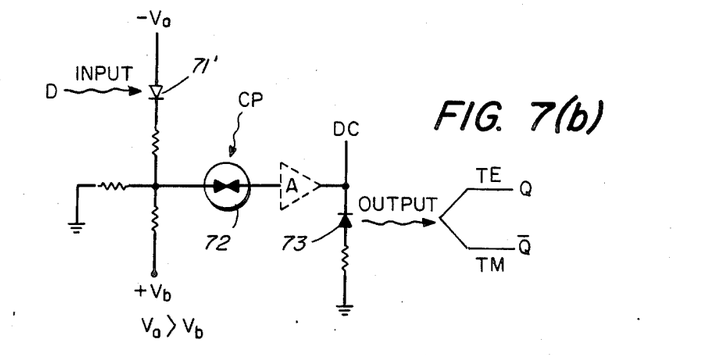
Figure 7C:
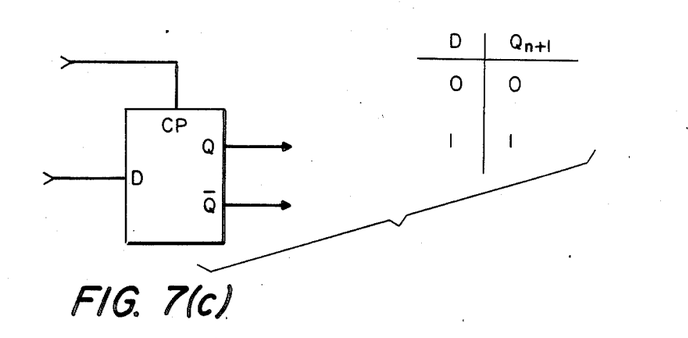

FIG. 7B shows an alternative circuit using a photodetector 71' at the input port. FIG. 7C shows the logic diagram and the truth table of a D flip-flop.

J-K Flip-flop

Figure 8A:
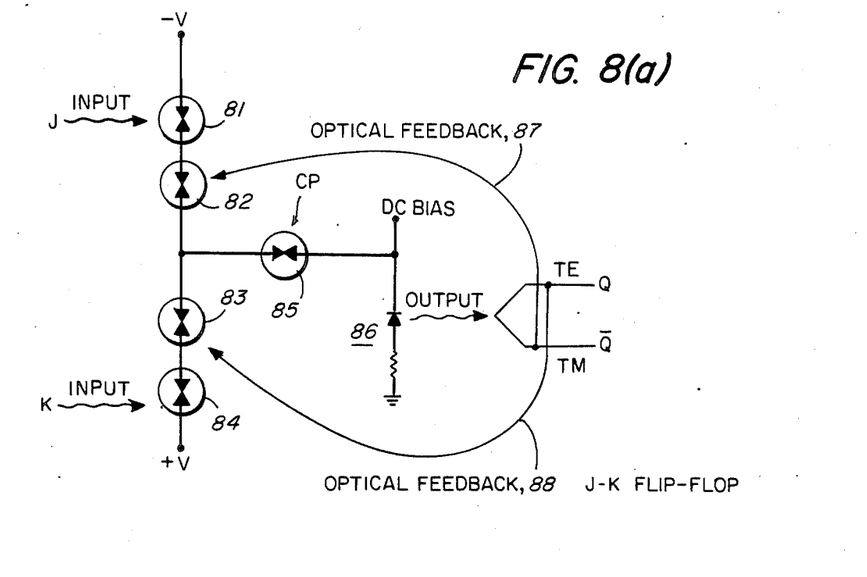
FIG. 8A is a circuit diagram and FIG. 8B shows a logic diagram and a truth table of an optical J-K flip-flop in accordance with still yet another embodiment of the invention.

The circuit diagram of an optical J-K flip-flop, which consists of five optoelectonic switches 81, 82, 83, 84, and 85, and two optical feedback lines 87, 88 is shown in FIG. 8A. The TE and TM optical output signals along the lines 88, 87, respectively, are fed back to control the optoelectronic switches 83 and 82, repectively. The optoelectronic switch 81 at the J input port and the optoelectronic switch 82 are connected in series and are biased with the negative voltage $-V$. The optoelectronic switch 84 at the K input port and the optoelectronic switch 83 are connected in series and are biased with a positive voltage $+V$. The fifth optoeClectronic switch 85 is activated by optical clock pulses to sample the input voltage from these two arms.

Consider, for a moment, a clock pulse occurring at the optoelectronic switch 85. When J=0 and K=0, no input voltage is applied to the optoelectronic switch 85 and no triggering pulse is switched. The laser is not triggered and stays in its previous state $Q_n$. When J=0 and K=1, the optoelectronic switch 81 opens and the optoelectronic switch 84 conducts. When $Q_n=0$, there is no TE feedback to turn on the optoelectronic switch 83. Again, no input voltage is applied to the optoelectronic switch 85 and the laser 86 stays in the condition $Q_{n+1}=Q_n=0$. When $Q_n=1$, the TE output is fed back to turn on the optoelectronic switch 83. A positive voltage is applied to the optoelectronic switch 85 which then switches out a positive pulse in synchronism with a clock pulse CP. The laser 86 is then triggered to switch into the TM mode resulting in $Q_{n+1}=0$. Similarly, the condition $J=1$ and $K=0$ always results in $Q_{n+1}=1$. When $J=1$ and $K=1$, both the optoelectronic switches 81, 84 conduct. When $Q_{n+1}=0$, a TM feedback signal, along the line 87, turns on the optoelectronic switch 82 and a negative pulse is switched by the optoelectronic switch 85 in synchronism with a clock pulse CP. The laser 86 then triggers to switch to the TE mode, resulting in $Q_{n+1}=1$. When $Q_n=1$, the optoelectronic switch 83 is turned on by a TE feedback signal and a positive pulse is switched by the optoelectronic switch 85 to trigger the laser 86 into the TM mode. The output thus switches to $Q_{n+1}=0$ at the time the clock pulse CP occurs. Therefore, the output always changes state at the arrival of a clock pulse CP when $J=1$ and $K=1$.

Figure 8B:
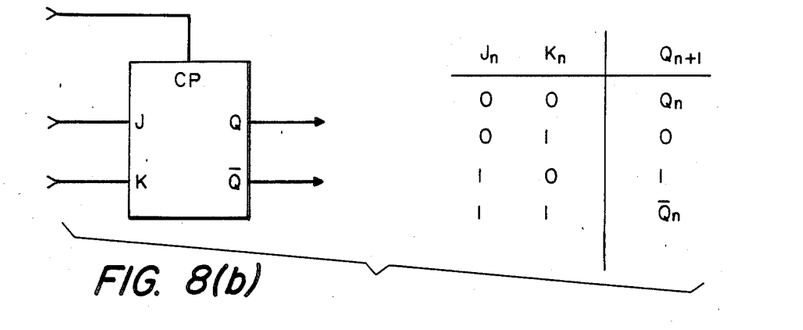

In an alternative circuit, not shown, the optoelectronic switches 81 through 84 can be replaced with photodetectors under reverse bias. FIG. 8B shows the logic diagram and the truth table of the J-K flip-flop.

T Flip-flop

Figure 9A:
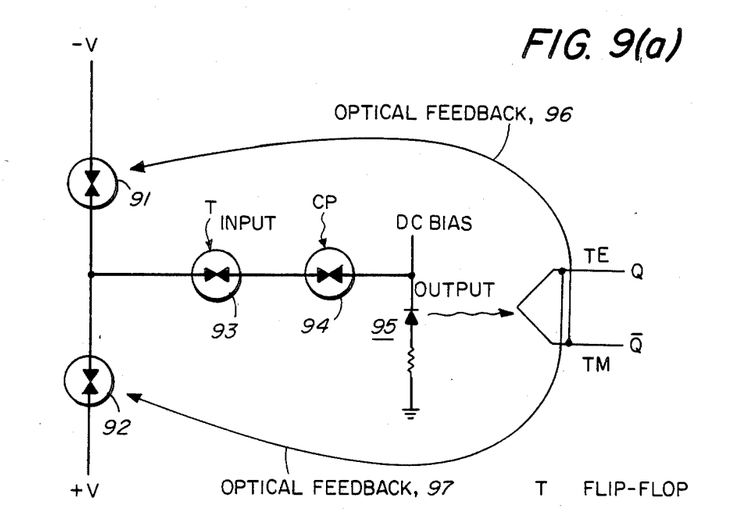
FIG. 9A is a circuit diagram and FIG. 9B shows a logic diagram and a truth table of an optical T flip-flop in accordance with yet another embodiment of the invention.

The circuit of an optical T flip-flop, depicted in FIG. 9A, consists of four optoelectronic switches 91, 92, 93, and 94 and two optical feedback lines 96, 97. When a clock pulse CP arrives, if $T=0$, the optoelectronic switch 93 is open circuited and no triggering voltage pulse can propagate through the optoelectronic switch 94. The laser 95 stays in its previous state $Q_{n+1}=Q_n$. When $T=1$, the optoelectronic switch 93 is conductive. If $Q_n=0$, a TM feedback signal, along the line 96, turns on the optoelectronic switch 91. A negative pulse is propagated through the optoelectronic switch 94 under the excitation of a clock pulse CP. This triggers the laser 95 to switch to the TE mode resulting in $Q_{n+1}=1$. Similarly, if $T=1$ and $Q_n=1$, then $Q_{n+1}=\overline{Q_n}=0$. Therefore, the T flip-flip always toggles or changes state with every input clock pulse CP as long as the input T is at logic 1.

Figure 9B:
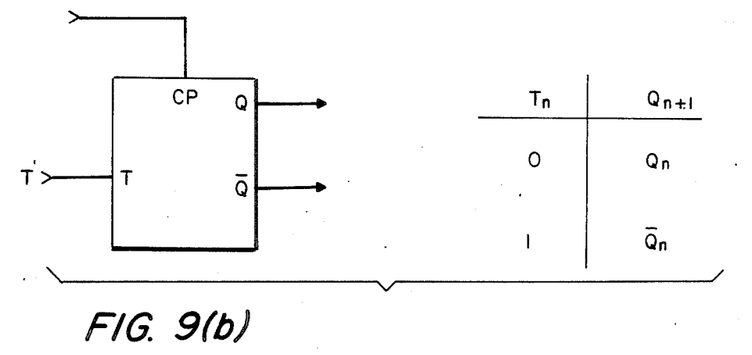

In an alternative circuit, the two optoelectronic switches, 91 and 92, can be replaced with two reverse biased photodetectors (not shown). FIG. 9B shows the logic diagram and a truth table for a T flip-flop.

In General

Although various characteristics may vary from one polarization-bistable laser to another, the following characteristics of one specific laser is set forth by way of example:
InGaAsP/InP laser
Polarization transition temperature of 193.0° K., having hysteresis loops with a width of 3.5 mA.
"Near the polarization transition temperature" incudes a range from 186.7° K. to below 195.2° K., where hysteresis loop have widths in the range of about 1 mA to 23 mA.

In summary, the advantages of our optical gates and circuits and flip-flops set forth hereinabove include simplicity and high speed, operation at power levels of semiconductor lasers, compatibility with monolithic integration, direct complement functions obtainable from TE and TM output signals, and high extinction ratios of the "on" and "off" states.

Various modifications can be performed to this invention without departing from the spirit and scope of the appended claims.

What is claimed is:

1. Polarization-bistable apparatus comprising
   a semiconductor laser operating near the polarization transition temperature wherein said laser operates in a pure $TM_{oo}$ mode at low injection currents and switches operation to a pure $TE_{oo}$ mode at high injection currents, having hysteresis loops with a high contrast ratio in its polarization-resolved power versus current characteristic while total power exhibits only slight change in hysteresis, the switching behavior of the $TE_{oo}$ mode being complementary to that of the $TM_{oo}$ mode;
   means for biasing said laser for operation within said hysteresis loops; and
   means for applying a current pulse in one direction to said laser to cause said laser to provide a $TE_{oo}$ mode laser output, and for applying a current pulse in the opposite direction to switch to a $TM_{oo}$ mode.

2. The apparatus as recited in claim 1 wherein said laser is an InGaAsP/InP laser; near the polarization transistion temperature includes a range from 186.7° K. to below 195.2° K.; and said hysteresis loops have widths in the range of about 1 mA to 23 mA.

3. The apparatus as recited in claim 2 wherein said laser operates at a temperature of 193.0° K. and said loops have a width of 3.5 mA.

4. An optical S-R flip-flop comprising
   a semiconductor laser operating near the polarization transition temperature wherein said laser operates in a pure $TM_{oo}$ mode at low injection currents and switches operation to a pure $TE_{oo}$ mode at high injection currents, having large hysteresis loops with a high contrast ratio in its polarization-resolved power versus current characteristic while total power exhibits only slight change in hysteresis, the switching behavior of the $TE_{oo}$ mode being complementary to that of the $TM_{oo}$ mode;
   means for biasing said laser for operation within said hysteresis loops;
   first means, coupled across a voltage source of one polarity and said laser, for causing said laser to switch to said $TE_{oo}$ mode operation following application of an optical signal S thereto; and
   second means, coupled across a voltage source of the opposite polarity and said laser, for causing said laser to switch to said $TM_{oo}$ mode operation following application of an optical signal R thereto.

5. The S-R flip-flop as recited in claim 4 further comprising third means coupled between said first means and said laser, and coupled between said second means and said laser, for providing a conductive path through said third means upon said third means receiving an optical clock pulse.

6. The S-R flip-flop as recited in claim 5 wherein said laser is an InGaAsP/InP laser;
   near the polarization transistion temperature includes a range from 186.7° K. to below 195.2° K.;
   said hysteresis loops have widths in the range of about 1 mA to 23 mA; and
   said third means includes a high-speed optoelectronic switch.

7. The S-R flip-flop as recited in claim 6 wherein said first means includes a high-speed optoelectronic switch;
said second means includes a high-speed optoelectronic switch;
said laser operates at a temperature of 193.0° K.; and
said loops have a width of 3.5 mA.

8. The S-R flip-flop as recited in claim 6 wherein
said first means includes a photodetector;
said second means includes a phototdetector;
said third means includes a serially connected amplifier;
said laser operates at a temperature of 193.0° K.; and
said loops have a width of 3.5 mA.

9. An optical D flip-flop comprising
a semiconductor laser operating near the polarization transition temperature wherein said laser operates in a pure $TM_{oo}$ mode at low injection currents and switches operation to a pure $TE_{oo}$ mode at high injection currents, having large hysteresis loops with a high contrast ratio in its polarization-resolved power versus current characteristic while total power exhibits only slight change in hysteresis, the switching behavior of the $TE_{oo}$ mode being complementary to that of the $TM_{oo}$ mode;
means for biasing said laser for operation within said hysteresis loops;
first means, coupled across a voltage source of one polarity and a junction point, for providing a voltage of said one polarity to said junction point upon application of an optical signal D to said first means;
second means coupled across a voltage source of the opposite polarity and said junction point, for providing a voltage of said opposite polarity to said junction point upon the absence of an optical signal D to said first means; and
third means, coupled between said junction point and said laser, for providing a conductive path through said third means upon said third means receiving an optical clock pulse.

10. The D flip-flop as recited in claim 9 wherein
said laser is an InGaAsP/InP laser;
near the polarization transition temperature includes a range from 186.7° K. to below 195.2° K.;
said hysteresis loops have widths in the range of about 1 mA to 23 mA; and
said third means includes a high-speed optoelectronic switch.

11. The D flip-flop as recited in claim 10 wherein
said first means includes a high-speed electronic switch;
said second means includes a resistance;
said laser operates at a temperature of 193.0° K.; and
said loops have a width of 3.5 mA.

12. The D flip-flop as recited in claim 10 wherein
said first means includes a photodetector;
said second means includes a resistance;
said third means includes a serially connected amplifier;
said laser operates at a temperature of 193.0° K.; and
said loops have a width of 3.5 mA.

13. An optical J-K flip-flop comprising
a semiconductor laser operating near the polarization transition temperature wherein said laser operates in a pure $TM_{oo}$ mode at low injection currents and switches operation to a pure $TM_{oo}$ mode at high injection currents, having large hysteresis loops with a high contrast ratio in its polarization-resolved power versus current characteristic while total power exhibits only slight change in hysteresis, the switching behavior of the $TE_{oo}$ mode being complementary to that of the $TM_{oo}$ mode;
means for biasing said laser for operation within said hysteresis loops;
first means, coupled between a junction point and said laser, for providing a conductive path through said first means upon said first means receiving an optical clock pulse;
second means, coupled between a voltage source of one polarity and said junction point, for providing a conductive path when said laser operates in said $TM_{oo}$ mode;
third means, coupled between a voltage source of the opposite polarity and said junction point, for providing a conductive path when said laser operates in said $TE_{oo}$ mode;
fourth means, coupled serially with said second means, for causing said laser (if previously in the $TM_{oo}$ mode) to switch to said $TE_{oo}$ mode upon said fourth means receiving an optical signal J thereto and said first means receiving an optical clock pulse; and
fifth means, coupled serially with said third means, for causing said laser (if previously in the $TE_{oo}$ mode) to switch to said $TM_{oo}$ mode upon said third means receiving an optical signal K thereto and said first means receiving an optical clock pulse.

14. The J-K flip-flop recited in claim 13 wherein
said laser is an InGaAsP/InP laser;
near the polarization transition temperature includes a range from 186.7° K. to below 195.2° K.;
said hysteresis loops have a width in the range of about 1 mA to 23 mA; and
said first means includes a high-speed optoelectronic switch.

15. The J-K flip-flop recited in claim 14 wherein
each of said second, third, fourth, and fifth means includes a respective high-speed optoelectronic switch;
said laser operates at a temperature of 193.0° K.; and
said loops have a width of 2.5 mA.

16. An optical T flip-flop comprising
a semiconductor laser operating near the polarization transition temperature wherein said laser operates in a pure $TM_{oo}$ mode at low injection currents and switches operation to a pure $TE_{oo}$ mode at high injection currents, having large hysteresis loops with a high contrast ratio in its polarization-resolved power versus current characteristic while total power exhibits only slight change in hysteresis, the switching behavior of the $TE_{oo}$ mode being complementary to that of the $TM_{oo}$ mode;
means for biasing said laser for operation within said hysteresis loops;
first means, coupled across a voltage source of one polarity and a junction point, for providing a conductive path thereacross when said laser operates in the $TM_{oo}$ mode;
second means, coupled across a voltage source of the opposite polarity and said junction point, for providing a conductive path thereacross when said laser operates in the $TE_{oo}$ mode; and
third and fourth means serially coupled across said junction point and said laser;
said third means being conductive upon receipt of an optical T pulse applied thereto; and said fourth means being conductive upon receipt of an optical clock pulse applied thereto.

17. The T flip-flop as recited in claim 16 wherein
said laser is an InGaAsP/InP laser;
near the polarization transition temperature includes a range from 186.7° K. to below 195.2° K.;
said hysteresis loops have widths in the range of about 1 mA to 23 mA; and
said fourth means includes a high-speed optoelectronic switch.

18. The T flip-flop as recited in claim 17 wherein
each of said first, second, and third means includes a respective high-speed optoelectronic switch;
said laser operates at a temperature of 193.0° K.; and
said loops have a width of 3.5 mA.

19. An optical TE-AND (TM-NAND) gate comprising
a semiconductor laser diode operating at the polarization transition temperature wherein said laser diode operates in a pure TM mode at low injection currents and operates in a pure TE mode at high injection currents, said laser diode abruptly changing its modal state at a polarization-switching current level, $I_c$;
means for biasing said laser diode just below said polarization-switching current level $I_c$; and
a pair of optoelectronic switching means coupled across said laser diode and a voltage source of such polarity that when both of said pair of switching means are conductive, the injection current level is higher than $I_c$ and said laser diode switches into the TE polarization, whereby said laser diode provides a TE output representing the logic function A·B and said laser diode provides a TM output representing the logic function $\overline{A \cdot B}$, whereby one of said switching means is normally non-conductive but is rendered conductive upon receiving a light signal representing the function A, and whereby the other of said switching means is normally non-conductive but is rendered conductive upon receiving a light signal representing the function B.

20. The optical TE-AND (TM-NAND) gate as recited in claim 19 wherein
said laser diode is an InGaAsP/InP laser diode;
said polarization transition temperature is 194.2° K.; and
said polarization switching current level $I_c$ is 15 mA.

21. The optical TE-AND (TM-NAND) gate as recited in claim 19 wherein said optoelectronic switching means are photodetectors.

22. An optical TE-NAND (TM-AND) gate comprising
a semiconductor laser diode operating at the polarization transition temperature wherein said laser diode operates in a pure TM mode at low injection currents and operates in a pure TE mode at high injection current, said laser diode abruptly changing its modal state at a polarization-switching current level $I_c$;
means for biasing said laser diode at a current level above $I_c$; and
a pair of optoelectronic switching means coupled across said laser diode and a voltage source of such polarity that when both of said pair of switching means are conductive, the injection current level is lower than $I_c$ and said laser diode switches into the TM polarization,, whereby said laser diode provides a TE output representing the logic function $\overline{A \cdot B}$ and said laser diode provides a TM output representing the logic function $\overline{\overline{A \cdot B}}$, whereby one of said switching means is normally non-conductive but is rendered conductive upon receiving a light signal representing the function A, and whereby the other of said switching means is normally non-conductive but is rendered conductive upon receiving a light signal representing the function B.

23. The optical TE-NAND (TM-AND) gate as recited in claim 22 wherein .
said laser diode is an InGaAsP/InP laser diode;
said polarization transition temperature is 194.2° K.; and
said polarization switching current level $I_c$ is 15 mA.

24. The optical TE-NAND (TM-AND) gate as recited in claim 22 wherein said optoelectronic switching means are photodetectors.

25. An optical TE-OR (TM-NOR) circuit comprising
a semiconductor laser diode operating at the polarization transition temperature wherein said laser diode operates in a pure TM mode at low injection currents and operates in a pure TE mode at high injection currents, said laser diode abruptly changing its modal state at a polarization-switching current level $I_c$;
means for biasing said laser diode at a current level just below $I_c$; and
a pair of optoelectronic switching means coupled in parallel across said laser diode and a voltage source of such value that when either one of said switching means is conductive, the injection current level is higher than $I_c$ and said laser diode switches into the TE polarization,
said laser diode providing a TE output representing the logic function A+B and said laser diode providing a TM output representing the logic function $\overline{A + B}$, whereby one of said switching means is normally non-conductive but is rendered conductive upon receiving a light signal representing the function A, and whereby the other of said switching means is normally non-conductive but is rendered conductive upon receiving a light signal representing the function B.

26. The optical TE-OR (TM-NOR) circuit as recited in claim 25 wherein said optoelectronic switching means are photodetectors.

27. The optical TE-OR (TM-NOR) circuit as recited in claim 25 wherein
said laser diode is an InGaAsP/InP laser diode;
said polarization transition temperature is 194.2° K.; and
said polarization switching current level $I_c$ is 15 mA.

28. An optical TE-NOR (TM-OR) circuit comprising
a semiconductor laser diode operating at the polarization transition temperature wherein said laser diode operates in a pure TM mode at low injection currents and operates in a pure TE mode at high injection currents, said laser diode abruptly changing its operative mode at a polarization-switching current level $I_c$;
means for biasing said laser diode at a current level just above $I_c$; and
a pair of optoelectronic switching means coupled in parallel across said laser diode and a voltage source of such value that when either one of said switching means is conductive, the injection current is lower than $I_c$ and said laser diode switches into the TM mode, whereby said laser diode provides a TE output representing the logic function $\overline{A}+\overline{B}$ and said laser diode provides a TM ouput representing the logic function $A+B$, whereby one of said switching means is normally non-conductive but is rendered conductive upon receiving a light signal representing the function A, and whereby the other of said switching means is normally non-conductive but is rendered conductive upon receiving a light signal representing the function B.

29. The optical TE-NOR (TM-OR) circuit as recited in claim 28 wherein said optoelectronic switching means are photodetectors.

30. The optical TE-NOR (TM-OR) circuit as recited in claim 28 wherein
said laser diode is an InGaAsP/InP laser diode;
said polarization transition temperature is 194.2° K.; and
said polarization switching current level $I_c$ is 15 mA.

31. An optical logic-memory apparatus
a semiconductor laser diode operating at the polarization transition temperature as a logic device wherein said laser diode operates in a pure TM mode at low injection currents and operates in a pure TE mode at high injection currents, said laser diode abruptly changing its operative mode at a polarization-switching current level $I_c$, and operating near the polarization transition temperature wherein said laser diode operates in a pure $TM_{oo}$ mode at low injection currents and switches operation to a pure $TE_{oo}$ mode at high injection currents having large hysteresis loops with a high contrast ratio in its polarization-resolved power versus current characteristic while total power exhibits only slight change in hysteresis, the switching behavior of the TE mode being complementary to that of the TM mode;
means for biasing said laser diode; and
optoelectronic means coupled to said laser diode for affecting the modal state of said laser diode.

32. The optical logic/memory apparatus as recited in claim 31 wherein
said laser diode is an InGaAsP/InP laser diode;
said polarization transition temperature is 194.2° K.; and
near the polarization transition temperature includes a range from 186.7° K. to below 195.2° K.

* * * * *